(12) United States Patent
Chen et al.

(10) Patent No.: US 7,102,914 B2
(45) Date of Patent: Sep. 5, 2006

(54) GATE CONTROLLED FLOATING WELL VERTICAL MOSFET

(75) Inventors: Xiangdong Chen, Poughquag, NY (US); Dureseti Chidambarrao, Weston, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 10/708,381

(22) Filed: Feb. 27, 2004

(65) Prior Publication Data

US 2005/0190590 A1    Sep. 1, 2005

(51) Int. Cl.
*G11C 11/24* (2006.01)
*G11C 11/34* (2006.01)

(52) U.S. Cl. ........... 365/149; 365/185.24; 257/220

(58) Field of Classification Search ........... 365/149, 365/131, 185.24; 257/220, 301; 438/259
See application file for complete search history.

(56) References Cited

U.S. PATENT DOCUMENTS

| | | | |
|---|---|---|---|
| 4,713,678 A | 12/1987 | Womack et al. ........ 357/23.6 |
| 5,455,801 A | 10/1995 | Blodgett et al. ........ 365/222 |
| 6,269,280 B1* | 7/2001 | Miyanishi et al. ........ 700/121 |
| 6,437,388 B1* | 8/2002 | Radens et al. ........ 257/301 |
| 6,534,824 B1 | 3/2003 | Mandelman et al. ........ 257/306 |
| 6,573,561 B1* | 6/2003 | Chidambarrao et al. .... 257/335 |
| 6,667,504 B1* | 12/2003 | Beintner et al. ........ 257/302 |
| 2003/0082876 A1 | 5/2003 | Mandelman et al. ........ 438/243 |
| 2003/0116792 A1 | 6/2003 | Chen et al. ........ 257/220 |
| 2003/0155609 A1* | 8/2003 | Mandelman et al. ........ 257/331 |
| 2003/0224573 A1* | 12/2003 | Chidambarrao et al. .... 438/258 |
| 2005/0045936 A1* | 3/2005 | Chang et al. ........ 257/301 |

* cited by examiner

*Primary Examiner*—Richard Elms
*Assistant Examiner*—Alexander Sofocleous
(74) *Attorney, Agent, or Firm*—Scully, Scott, Murphy & Presser, P.C.; Joseph P. Abate, Esq.

(57) ABSTRACT

A novel transistor structure for a DRAM cell includes two deep trenches, one trench including a vertical storage cell for storing the data and the second trench including a vertical control cell for controlling the p-well voltage, which, in effect, places part of the p-well in a floating condition thus decreasing the threshold voltage as compared to when the vertical pass transistor is in an off-state. This enables the transistor to exhibit increased gate overdrive and drive current during an active wordline voltage commonly applied to both gates of the storage and control cells.

11 Claims, 9 Drawing Sheets

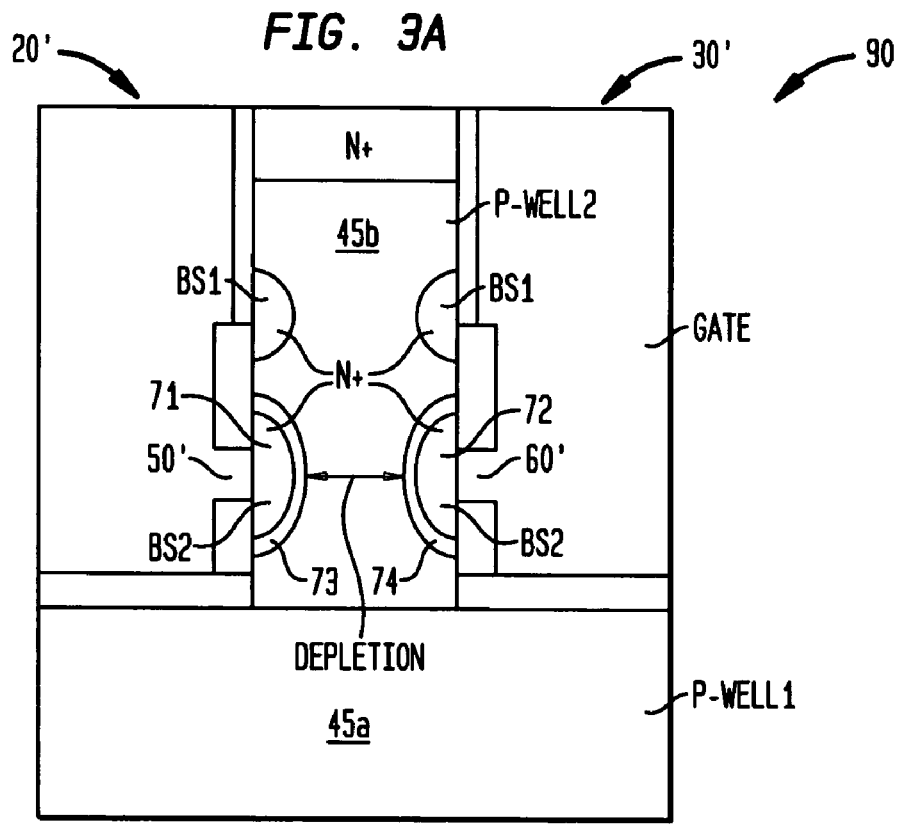
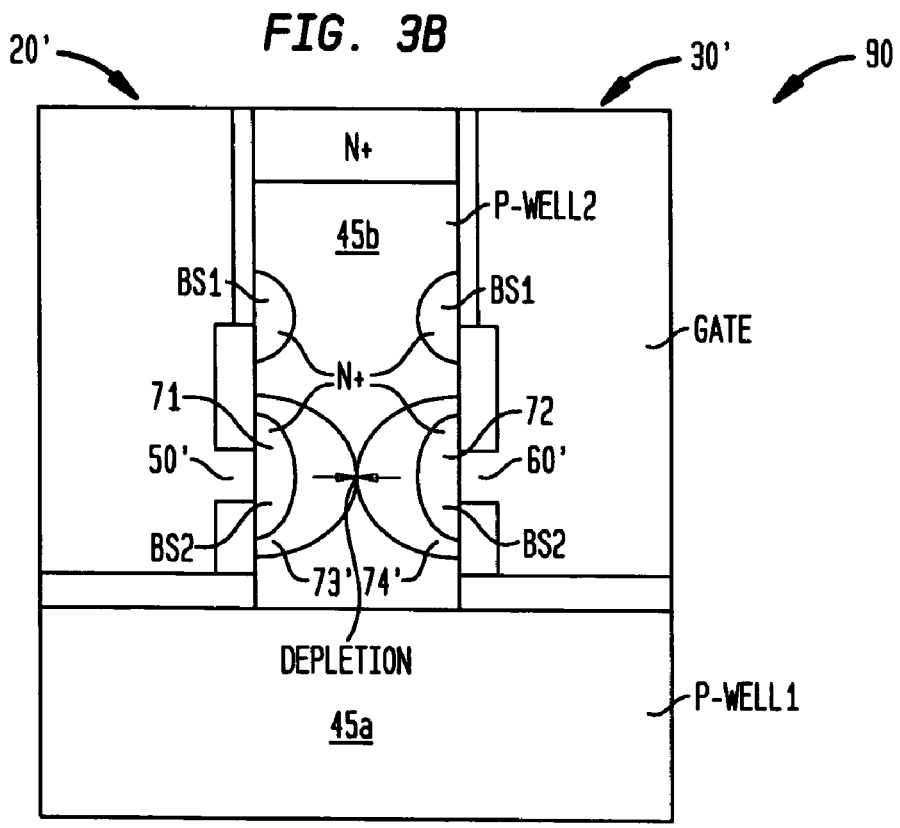

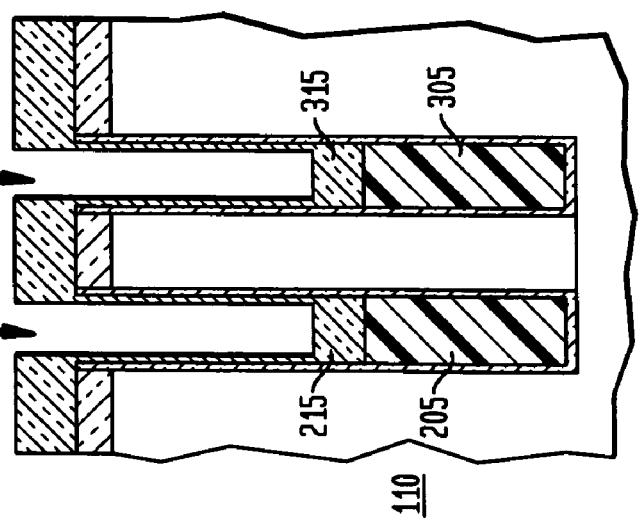
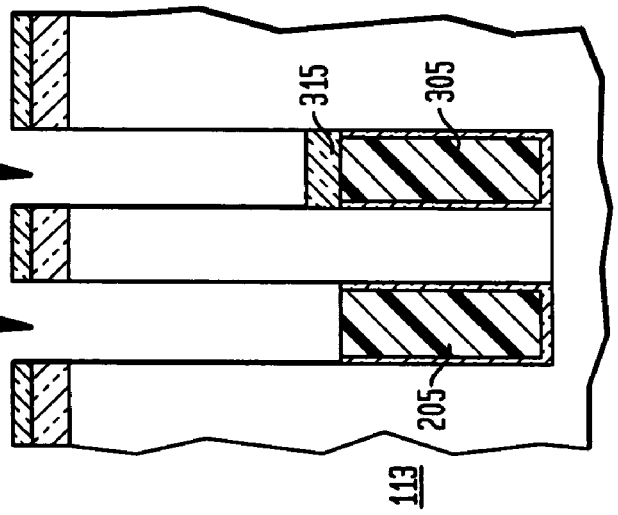
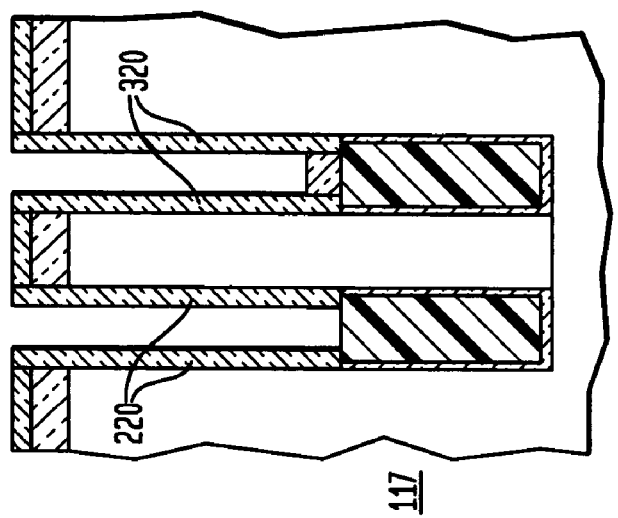

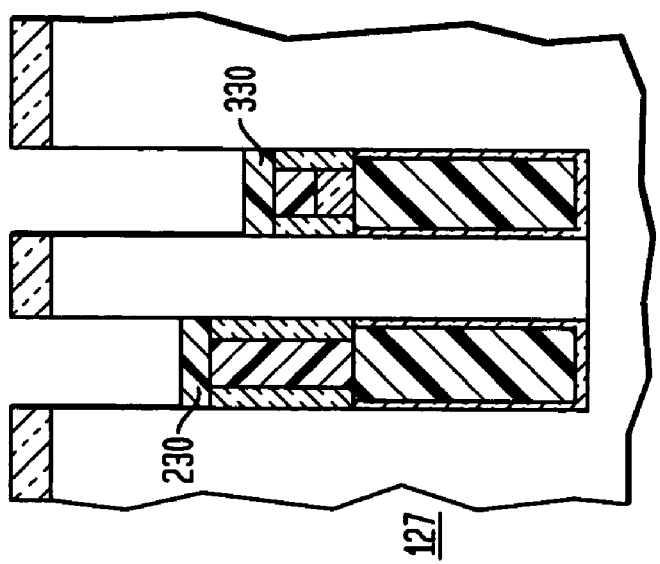
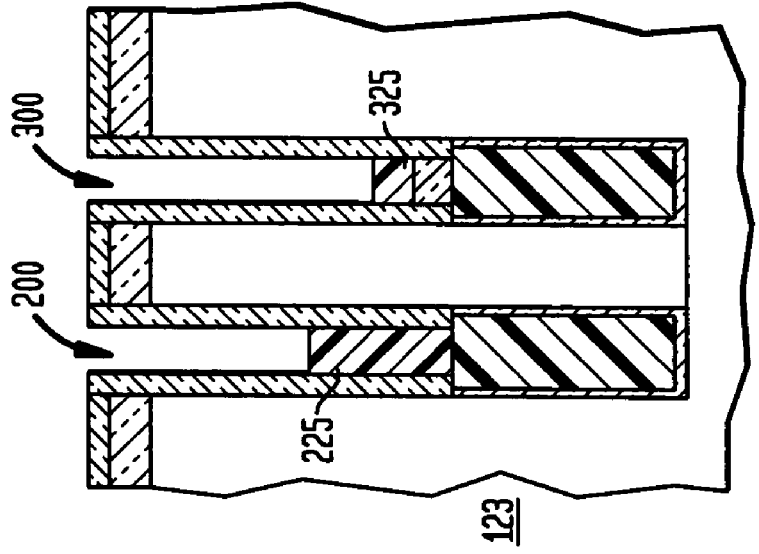
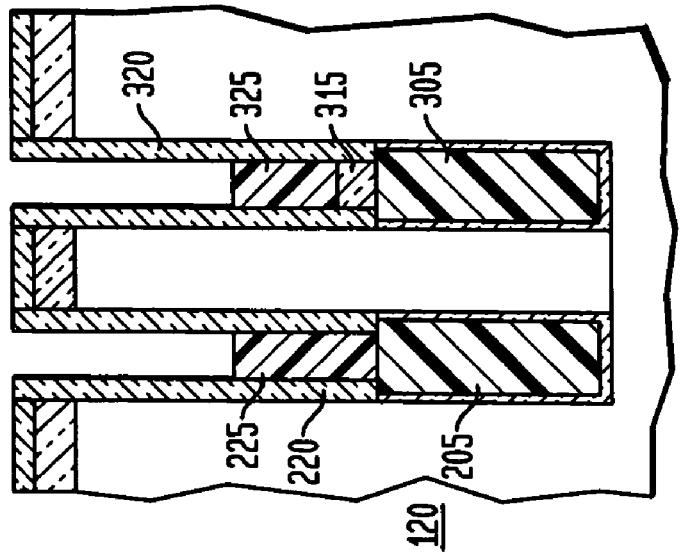

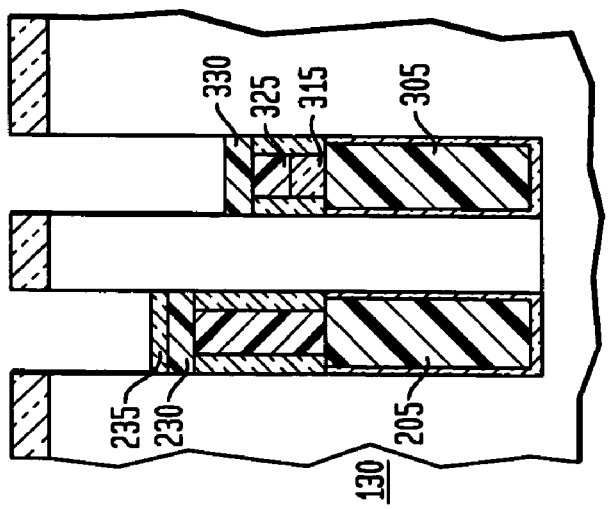
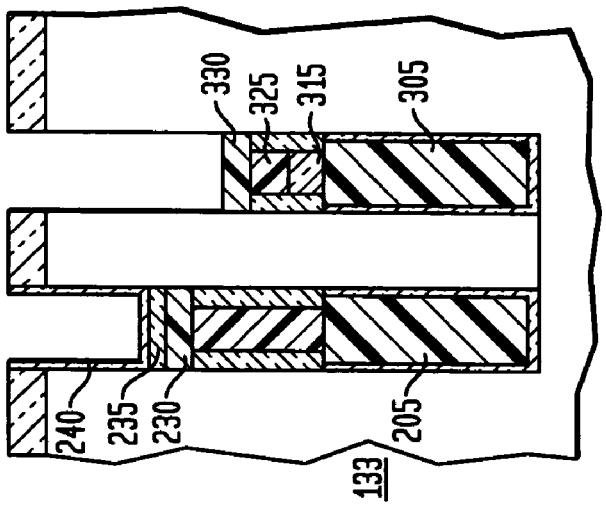
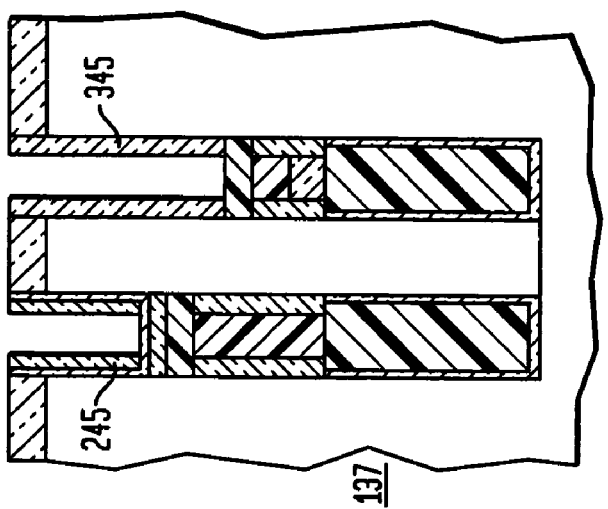

GATE CONTROLLED FLOATING WELL VERTICAL MOSFET

BACKGROUND OF INVENTION

The present invention related generally to MOSFET devices, and specifically to a novel floating well vertical MOSFET device implementing a gate control means for use in Dynamic Random Access Memory (DRAM) cell applications.

The key challenge in scaling of MOSFET is to improve the drive current and to keep sufficiently low off-state leakage current. As the gate oxide and channel length are scaled down, the operating voltage has also been scaled down continuously. The threshold voltage can not be scaled down as aggressively as the operating voltage because of the subthreshold leakage. Therefore, the gate over-drive is reduced while keeping low leakage in off-state. One possible solution is the dynamic threshold voltage MOSFET (DT-MOSFET) which connects the gate to a well. In the DT-MOSFET, high drive current and low off current can be obtained because of low threshold voltage in on-state and high threshold voltage in off-state. Unfortunately, the leakage current of the forward biased pn-junction at the source fatally increases at supply voltage higher than 0.7V. Therefore, the supply voltage must be reduced to be below 0.7V. In DRAM application, off-state leakage current, which limit the retention time, is very critical. Negative word line voltage has been proposed to reduce the off-state subthreshold leakage while keeping enough gate over-drive especially at write back conditions when the source of the transistor is near bit line high voltage level. With the negative word line low approach, another voltage source is needed and the device is more prone to gate induced drain leakage (GIDL) current.

It would thus be highly desirable to provide a floating well vertical MOSFET device implementing a gate control means to enable greater gate over-drive and drive currents.

SUMMARY OF INVENTION

According to one aspect of the invention, there is provided a novel transistor structure for a DRAM cell. The DRAM cell comprises two deep trenches, one trench comprising a storage cell for storing the data and the second trench comprising a control cell for controlling the p-well voltage, which, in effect, places part of the p-well in a floating condition thus decreasing the threshold voltage as compared to when the transistor is in an off-state. This enables the transistor to exhibit increased gate over-drive and drive current. In accordance with this aspect of the invention, the storage cell comprises a floating well vertical MOSFET device.

In a first embodiment, the storage cell includes a vertical pass transistor having a gate, and source and drain regions formed in a p-well, the drain region formed by a diffusion in said p-well outside the deep trench capacitor adjacent a first buried strap to conduct voltage to the trench capacitor. The control cell for controlling the threshold voltage of the vertical pass transistor, includes a second buried strap and diffusion region formed in the p-well region. According to the first embodiment, the second buried strap and diffusion region formed in the p-well region of the control cell is at a lower trench depth than the first buried strap and drain diffusion region formed in the p-well region of the storage cell. In this embodiment, the threshold voltage of the vertical pass transistor is controlled in accordance with a depletion region formed by application of the WL voltage, via a control cell gate, at the second buried strap region and diffusion region that extends sufficiently into the p-well to pinch off the p-well region to disconnect the p-well region into two regions, a first conductive and second floating p-well region, wherein the floating p-well region enables a lower threshold voltage for turning on the vertical pass transistor during WL active state. When the WL voltage indicates inactive state, the depletion region formed at the second buried strap and diffusion region does not pinch off the p-well. Thus, no floating p-well region is created resulting in no threshold voltage modification.

According to a second embodiment, a vertical transistor device having two trenches is shown including respective two first buried straps functioning as a drain or source diffusion region for the device and two second buried straps functioning as control diffusions are formed in the p-well region. In the transistor device, the two first buried straps are at an equal trench depth and the two second buried strap and control diffusions are at an equal trench depth below the corresponding first buried straps formed in the p-well. In this embodiment, the threshold voltage of the vertical transistor device is controlled in accordance with depletion regions formed by application of a voltage at the device gates, at both first and second buried strap region and diffusion regions, that extend sufficiently into the p-well and merge to effectively pinch off the p-well region to disconnect the p-well region into two regions, a first conductive and second floating p-well region, wherein the floating p-well region enables a lower threshold voltage for turning on the vertical pass transistor.

According to a further aspect of the invention, there is provided a method for manufacturing the novel DRAM cell of the invention. The novel DRAM structure of the present invention is fabricated with 110 nm, or less, vertical MOSFET DRAM fabrication technology.

BRIEF DESCRIPTION OF DRAWINGS

Further features, aspects and advantages of the structures and methods of the present invention will become better understood with regard to the following description, appended claims, and accompanying drawings with like elements represented by like reference numerals in the various figures, in which:

DETAILED DESCRIPTION

Figure 1:
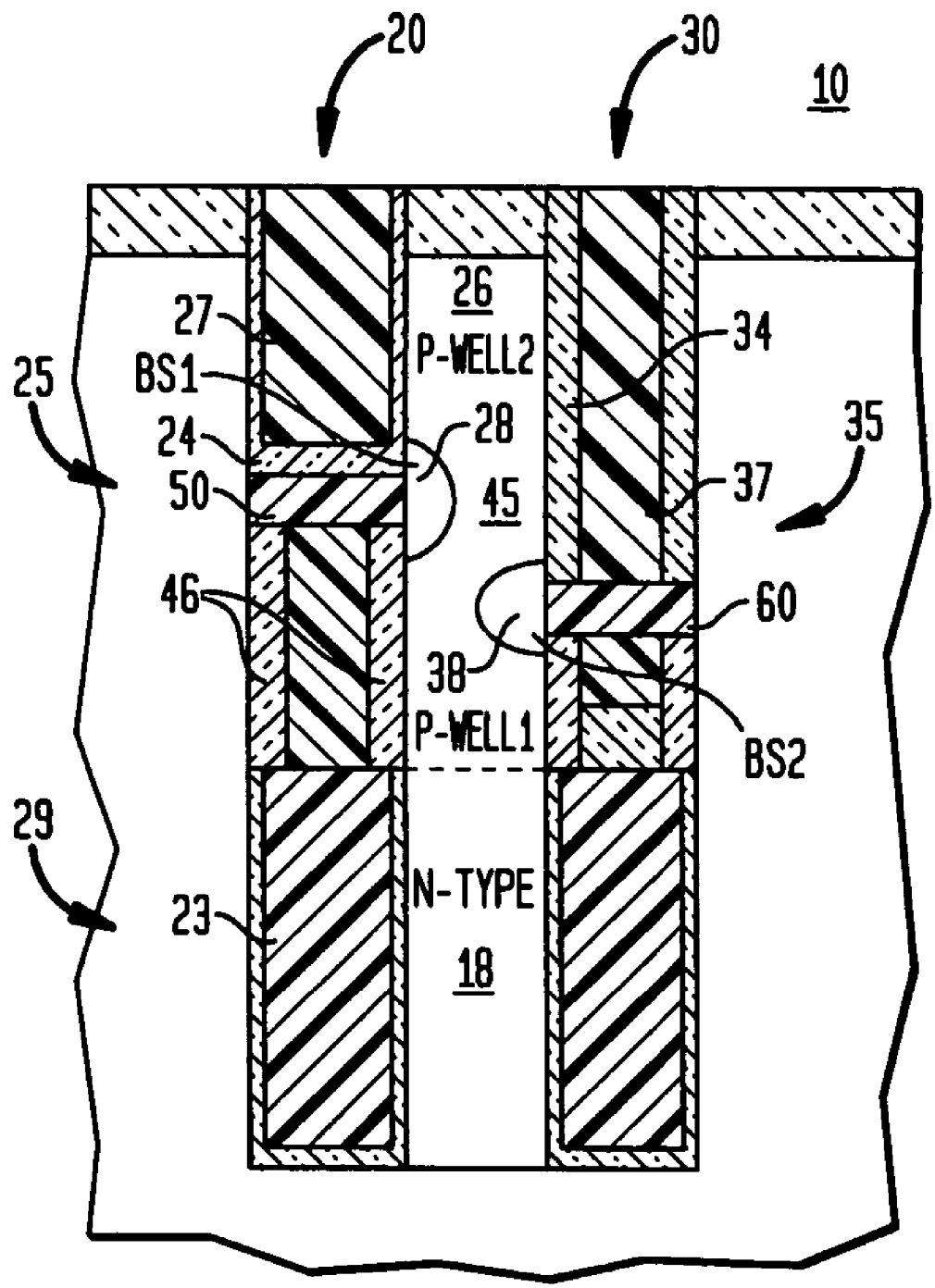
FIG. 1 depicts a cross-sectional view of the DRAM cell 10 having a storage cell 20 and a control cell 30 separated by a p-well region 45 according to the present invention.

FIG. 1 shows a cross-sectional view of the DRAM cell 10 having a storage cell 20 and a control cell 30 separated by a p-well region 45 manufactured in accordance with vertical trench DRAM technology. The storage cell 20 includes a vertical pass transistor device 25, for example, a MOSFET device, fabricated on a deep trench capacitor, for controlling the receipt, storage and retrieval of voltage in the deep trench capacitor 29. Particularly, data information comprising a voltage present on a bit line (BL) is stored in the capacitor 29 when a channel formed in the p-well conducts voltage from the bitline to the connected deep trench capacitor via a buried strap 50 and diffusion region 28 when the MOSFET device is turned on. This occurs, for instance, in response to application of a wordline (WL) voltage connecting a gate 27 of the vertical storage cell MOSFET device 25 during a DRAM write or read operation. Electrical connection of the bitline BL conductor to trench capacitor 29 is enabled by the pass transistor device 25 that enables channel conductivity to the buried strap diffusion region 50 of n+ type material upon application of a WL voltage to storage cell gate 27. The control cell 30 includes a vertical MOSFET device 35 that further responds to application of the wordline (WL) voltage for controlling the voltage of the p-well structure 45 in vertical DRAM technology. That is, the storage cell 20 and control cell 30 share the same WL. The control cell 30 additionally includes a buried strap diffusion region 60 of n+ type material, however, is lower in depth than the storage cell buried strap 50. That is, the IT depth of the control cell is below the second BS. Compared with the current IBM 110 nm DRAM technology, isolation trenches (IT) depth needs to be deeper, and a more advanced IT fill process such as SOG is used to fill the IT, as will be described in greater detail hereinbelow.

In the detailed cross-sectional view of the DRAM structure 10 including storage cell MOSFET 20 and control cell MOSFET 30 shown in FIG. 1, each storage cell 20 and control cell 30 is formed on a substrate having an n-type doped region forming a buried plate 18. The storage cell device 25 further includes a source region 26 doped with n+ type material, a P-type well 45 and a drain diffusion region 28 doped of n+ type material. The capacitor 29 is a deep trench type formed within a substrate, having an isolated region 23 filled with polysilicon material. The polysilicon conductor is isolated with a collar dielectric material 46, e.g., an oxide, separating the drain diffusion from a buried plate region of n type silicon, for example. The gate 27 of the storage transistor 25 is isolated from the conductor 23 of the deep trench capacitor 29 by a top trench dielectric layer 24, e.g., an oxide. The control cell device 35 includes the buried strap 60 of n+-type material and with a gate 37 and a gate dielectric 34. The control cell gate 37 is connected to the n+ diffusion buried strap (BS2) 60 and influences a n-type doped diffusion layer 38 formed in a later thermal process in the p-well when receiving the WL voltage. That is, as will be described, in response to application of the wordline voltage, a depletion region is formed in the p-well 45 which functions to control p-well voltage and hence improve performance of the storage cell 20.

Figure 2A:
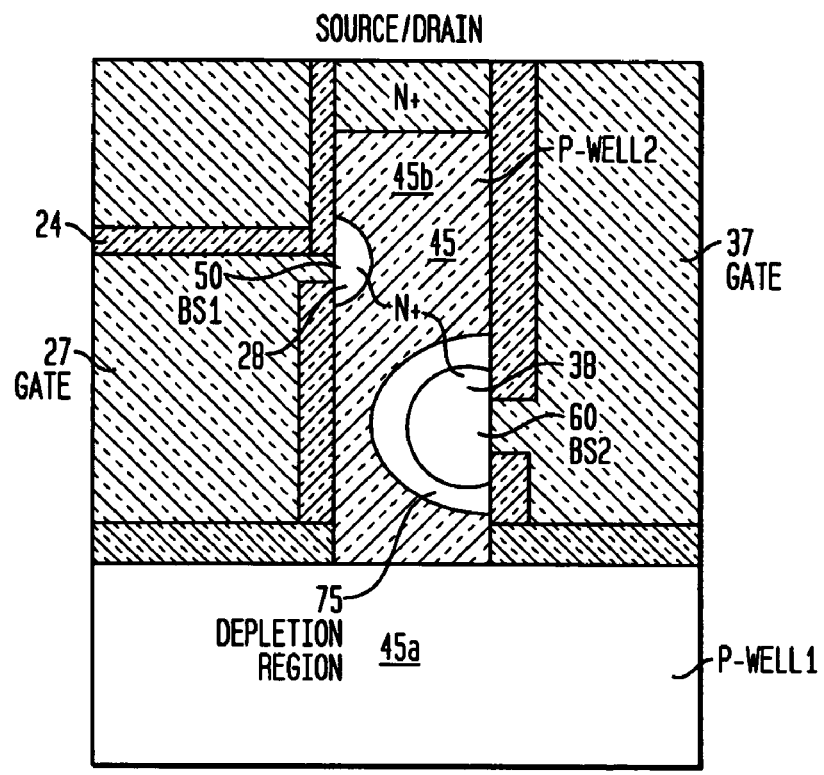
FIGS. 2(a) and 2(b) illustrate the operation of the novel DRAM control cell 30 for controlling the p-well voltage according to a first embodiment of the invention; and, FIGS. 3(a) and 3(b) illustrate the operation of a novel vertical transistor device of two trenches for controlling the p-well voltage according to a second embodiment of the invention.
Figure 2B:
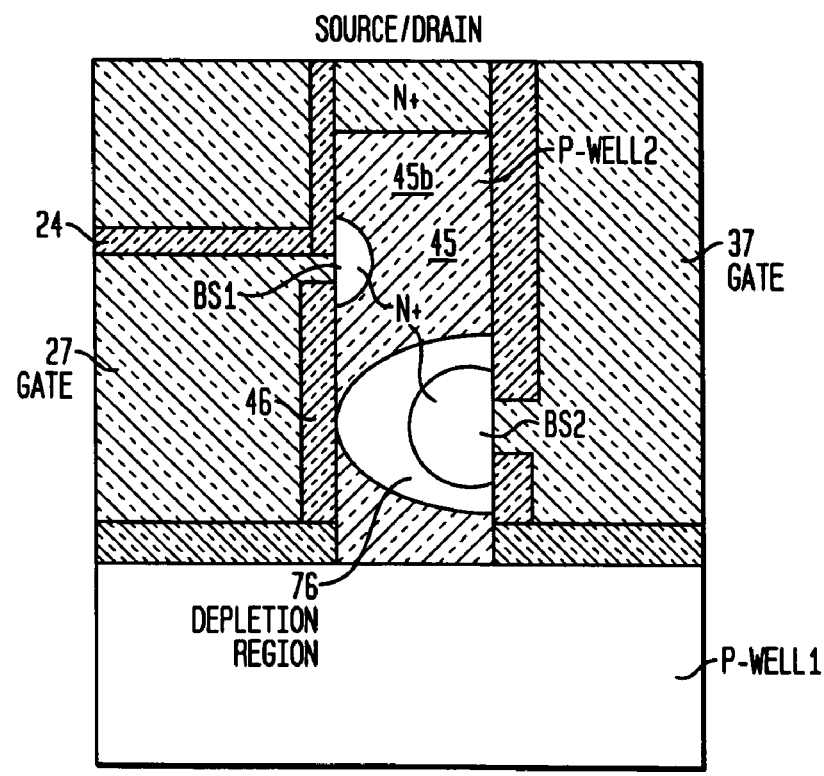

FIGS. 2(a) and 2(b) illustrate more clearly the operation of the novel DRAM control cell 30 for controlling the p-well voltage with FIG. 2(a) illustrating a depletion region 75 formed in the p-well 45 at the location of the control cell 20 buried strap 60 for controlling p-well voltage when the WL is at an off state (e.g., WL at 0 volts). FIG. 2(b) illustrates the depletion region 76 formed at the location of the control cell 30 buried strap 60 for controlling p-well voltage when the WL is in an active state, WL at positive voltage such as 3 V–4 V, for example). Particularly, as described with respect to FIGS. 2(a) and 2(b), when the p-well is connected to a negative voltage supply having a value such as 0.5V, for example, and WL is at ground, the lower buried strap 60 and resulting p-well depletion region 75 does not pinch off the p-type well 45. That is, at off-state, the control cell gate is at 0V, the depletion region 75 formed by the BS diffusion in the p-well does not block the path between p-well1 45a and p-well2 45b. Because of the body bias effect, a high enough Vt1 is achieved to achieve low off-state leakage current. As a result, the applied negative p-well voltage is sufficient to keep the Vt high enough to suppress the sub-threshold voltage in the storage cell MOSFET.

As shown in FIG. 2(b), when the WL is at an active state, the control cell 30 buried strap 60 is at high voltage, the depletion region 76 formed between the BS 60 and p-well is sufficient to pinch off the top p-well (pass transistor p-well2) and bottom p-well (p-well1 connected to a contact). The p-well 45b will thus be at a floating state, thereby improving gate drive current. That is, when the gate is activated, the depletion regions between formed in the p-well at BS 60 extends sufficiently toward the storage cell collar dielectric 45 to render the top p-well1 45b at floating condition. Utilizing current doping profiles, the depletion width has at least a 50 nm difference with WL at 3.0 volts versus 0.0 volts. Therefore, at this condition, the threshold voltage Vt2 is smaller than Vt1 and may range from 200 mV to 500 mV. Thus, the storage cell transistor can have more gate over drive and drive current.

It should be understood that in an alternative embodiment, shown in FIGS. 3(a) and 3(b), a (2-sided or 4-sided) vertical transistor device 90 comprising two trenches is provided. According to the invention, the device includes respective two first buried straps (BS1) functioning as a drain (or source) diffusion region for the device and two second buried straps (BS2) functioning to provide control diffusions are formed in the p-well region. In each trench of the transistor device shown, the two first buried straps (BS1) are at an equal trench depth and the two second buried straps (BS2) and control diffusions 71, 72 are at an equal trench depth below the corresponding first buried straps formed in the p-well. In this embodiment, the threshold voltage of the vertical transistor device is controlled in accordance with depletion regions formed by application of a voltage at the device gate, at both second buried strap regions and corresponding diffusions, that extend sufficiently into the p-well and merge to effectively pinch off the p-well region to disconnect the p-well region into two regions, a first conductive and second floating p-well region, wherein the floating p-well region enables a lower threshold voltage for turning on the vertical transistor device.

Thus, upon condition of off-state, the gate is at 0V, the depletion regions 73, 74 of respective BS2 diffusions 71, 72 in the p-well does not block the path between p-well1 45a and p-well2 45b. Because of the body bias effect, a high enough Vt1 is achieved to achieve low off-state leakage current. Upon condition of active-state, WL active (voltage>0, e.g., 3V–4V), the depletion regions 73", 74" of respective BS2 diffusions 71, 72 in the p-well at BS 50" and 60" extend sufficiently toward each other and merge together such that the top p-well1 45b is at floating condition. Therefore, at this condition, the threshold voltage Vt2 is smaller than Vt1, the storage cell transistor can have more gate over drive and drive current.

Figure 4C:
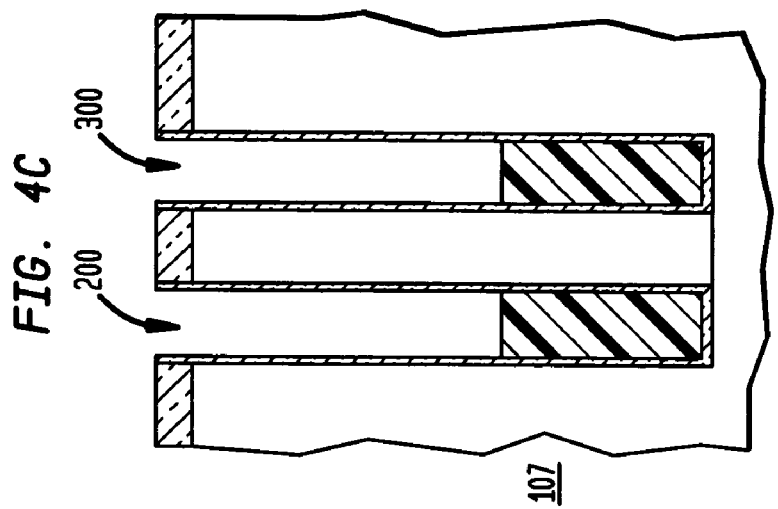
FIGS. 4(a)–4(o) depict the method for manufacturing the DRAM cell according to the first embodiment of the invention; and, FIG. 5 depicts an exemplary layout of several novel DRAM cells formed according to the fabrication techniques of the present invention.
Figure 4B:
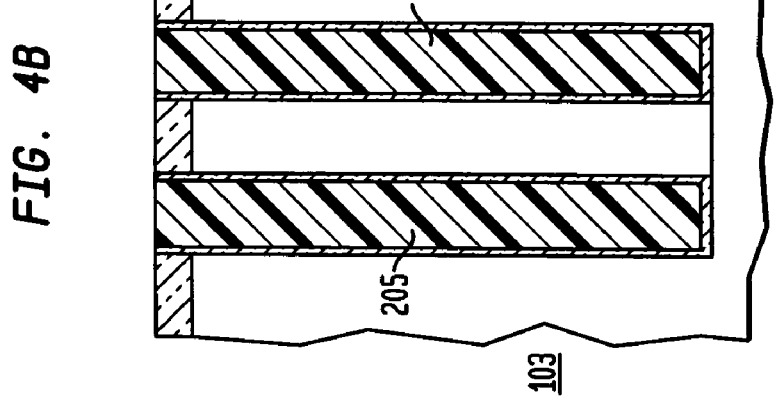
Figure 4A:
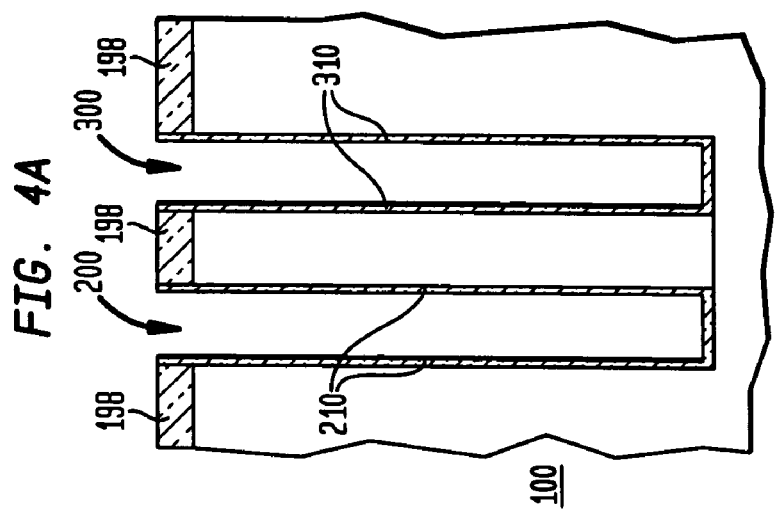
Figure 4M:
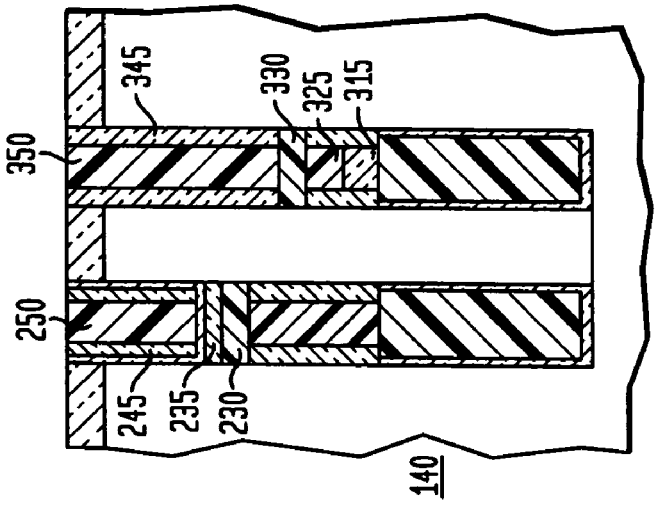
Figure 4N:
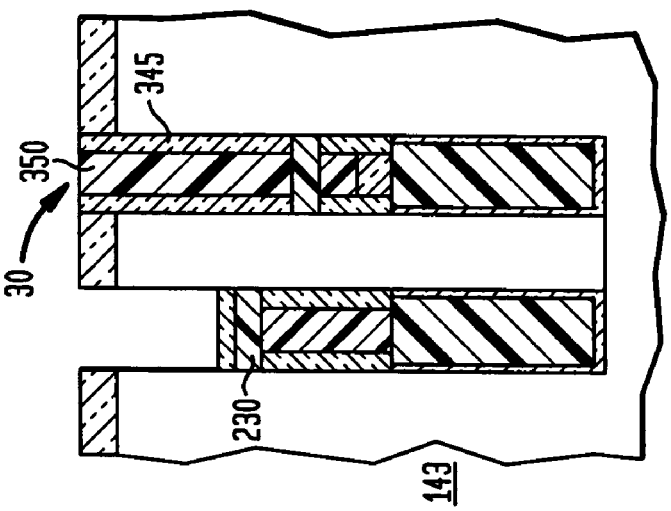
Figure 4O:
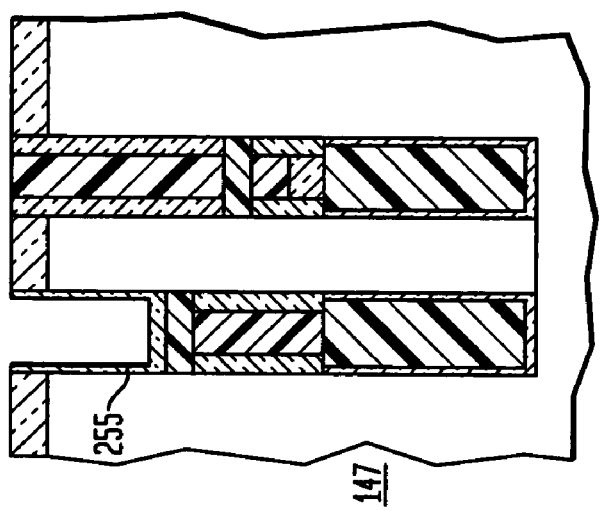

A method for manufacturing the DRAM cell of the invention including two trenches, one trench for storing the data and the second trench for controlling the p-well voltage, which, in effect, places part of the p-well in a floating condition thus decreasing the threshold voltage as compared to when the transistor is in an off-state is now described with respect to FIGS. 4(a)–4(o).

As shown at step 100 in the Process Flow diagram for fabricating the DRAM cell of FIG. 4(a), implementing deep trench lithography and patterning, deep trenches 200, 300 are formed in a doped P-type Si substrate using an etching technique such as Reactive ion etch (RIE). The trenches may range from between 5.0 and 8.0 micrometers deep, for example. Patterning includes use of a nitride or like materials, as the hard mask 198 for Si etch and, as shown, two deep trenches 200, 300 forming the DRAM Cell 10 of the invention result. The first deep trench 200 forms the data storage cell 20 and the second deep trench 300 for forming the control cell 30 to control the p-well voltage and improve DRAM cell gate drive and reduce leakage. After trench formation, a dielectric layer 210, 310 for the trench capacitor is formed on the sidewalls of each deep trench. The dielectric can be oxide, or an oxynitride, or other materials such as a high-K material in order to improve gate capacitance. As shown at step 103 of the Process Flow depicted in FIG. 4(b), each deep etch 200, 300 is filled with an n+ doped Polysilicon 205, 305 by a chemical vapor deposition (CVD) or like deposition process. To fill each deep trench, multiple deposition and etch processes have to be used. The resulting structure after polysilicon fill is shown in FIG. 4(b). As shown at step 106 of the Process Flow depicted in FIG. 4(c), each filled deep trench 200, 300 is recessed by a RIE process to a common depth. In the next step 110 depicted in FIG. 4(d), a dielectric material, such as an oxide, is deposited, by a CVD process, in each trench 200, 300. The dielectric layer 215, 315 formed is thinner on the side-wall than it is on the polysilicon fill 205, 305. The resulting structure is shown in FIG. 4(d). Then, in the next step 113 depicted in FIG. 4(e), the oxide 215, 315 previously deposited on each side wall is etched away by an etchant such as diluted HF, for example, or like etchant types. The oxide 215 above polysilicon 205 in the storage cell is completely etched away while the oxide 315 in the control cell partially remains as shown in the resulting structure of FIG. 4(e). This is enabled by implementing lithography and patterning while the storage cell is covered by photoresist during the oxide etch.

Further, in the next step 117, a dielectric layer such as an oxide layer 220, 320 is deposited in the trenches 200, 300 to a thickness ranging between 20 nm–30 nm, by a deposition process such as CVD. The oxide above the polysilicon in the storage cell is further etched away by RIE and the resulting structure is depicted in FIG. 4(f). Then, in the next step 120, another n+-type doped polysilicon layer 225, 325 is deposited in the trenches 200, 300 by a CVD process. Then in each trench, the polysilicon is etched back, e.g., recessed to a depth ranging from between about 300 nm to 500 nm, by an etching process such as RIE. The resulting structure is shown in FIG. 4(g). The recess depth for the storage cell determines the channel length of the vertical pass transistor. In a further step 123, the storage cell is covered by a photoresist material and the polysilicon 325 in the control cell trench 300 is recessed to a depth ranging from between about 400 nm 700 nm, for example, as shown in FIG. 4(h). This determines the location of the control cell buried strap 60. In a further step 127, the oxide layer 220, 320 on the side-walls of each trench 200, 300 deposited at step 117 (FIG. 4(f)), is etched away by a wet etch process. A very thin nitride layer is deposited on the side-wall to protect the side-wall (diffusion barrier). Polysilicon (e.g., n+-type doped) material 230, 330 is then deposited in each trench 200, 300 and recessed by a RIE process with the resulting structure shown in FIG. 4(i). This n+-type doped polysilicon 230, 330 is deposited to form the storage cell and control cell buried straps 50, 60 and n+ diffusion regions which, in the storage cell, connects the pass transistor to the capacitor in the device 10 of FIG. 1. The n-type dopant in the buried straps diffuses into the silicon to form the n-type diffusion regions 28, 38 in the device 10 of FIG. 1. In a next step 130, as was described herein with respect to FIGS. 4(d) and 4(f), dielectric material such as an oxide 235 is first deposited and etched away on the side-walls of each deep trench 200, 300 and completely removed from the control cell with the resulting structure shown in FIG. 4(j). The oxide remaining in the storage cell comprises the top trench dielectric layer 24 in the device 10 of FIG. 1. In a next step 133, a nitride layer 240 is then deposited in each trench 200, 300 and, in a subsequent process step, is completely etched away in the control cell trench 300 as shown in FIG. 4(k).

Figure 4P:
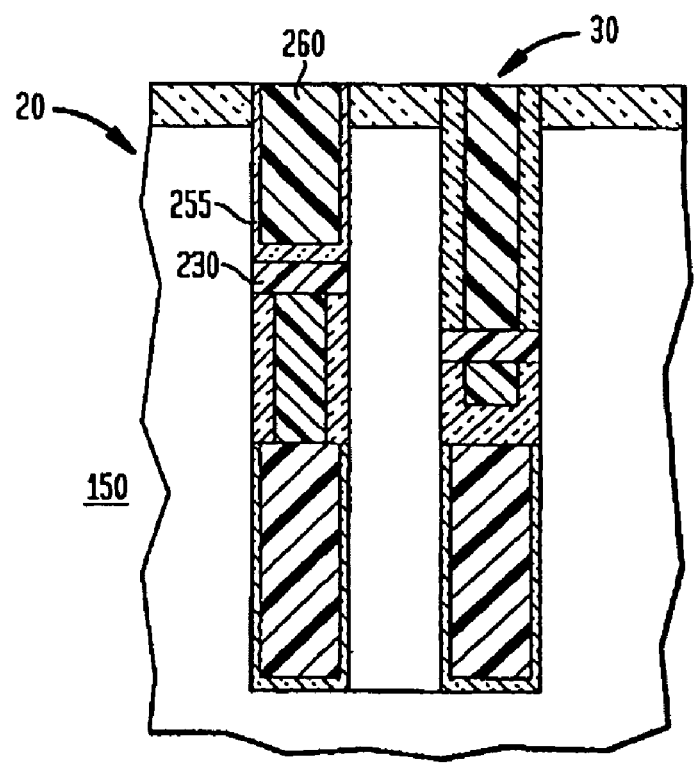

In a further step 137, a dielectric layer 245, 345 ranging between 10 nm–20 nm in thickness is deposited by a deposition process such as chemical vapor deposition in each trench 200, 300. Dielectric materials include an oxide, oxynitride or other like dielectric materials. Further, the dielectric layer is etched by an RIE process and the resulting structure is shown in FIG. 4(l). At next step 140, polysilicon 250, 350 is then deposited (CVD or like deposition process) in each of the remaining trenches 200 and 300 and planarized by a polished by chemical mechanical polishing (CMP) process. The resulting structure is shown in FIG. 4(m). In a further processing step 143, the polysilicon, oxide and nitride layers in the storage cell 20 are etched away by a wet chemical process. Given the variety of the layers, different etching process may be employed for removing each layer, one layer at a time. The control cell is covered by a photo resist during the wet etch process. The resulting structure is shown in FIG. 4(n). A gate dielectric layer 255 is then formed in the storage cell in the next process step 147. This layer can be materials such as oxide, nitride, or high-k material. The process can be thermal, CVD depending on the material used. The resulting structure is depicted in FIG. 4(o). The dielectric layer 255 forms the gate oxide of the vertical pass transistor device 10 of FIG. 1. Preferred gate dielectric materials include an oxide, oxynitride, and the like. In a final processing step 150, polysilicon 260 (e.g., n+ type doped) forming the gate conductor is deposited in each cell by a CVD process and planarized/polished by CMP process. The resulting structure is shown in FIG. 4(p).

The remaining process steps include the same processing steps required to form the DRAM by implementing conventional DRAM processes, for example, including interconnect wiring to form the DRAM cell.

Figure 5:
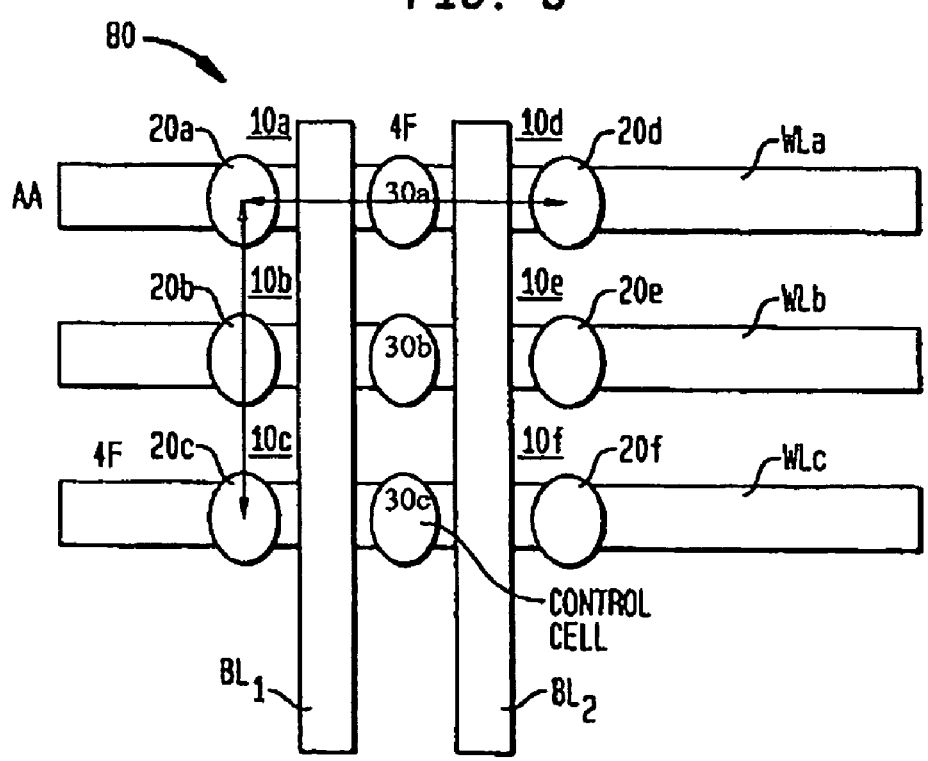

FIG. 5 depicts an exemplary layout 80 of several novel DRAM cells 10a, 10b, . . . 10f, formed according to the fabrication techniques of the present invention. The size for each cell is 8F2 which is the same as current 110 nm DRAM technology. Each DRAM cell 10a, 10b, 10c includes the respective vertical pass transistor storage cells 20a, 20b, 20c and control cells 30a, 30b, 30c all connected to wordlines WLa, WLb, WLc. Each DRAM cell 10d, 10e, 10f includes the respective vertical pass transistor storage cells 20a, 20b, 20c and control cells 30a, 30b, 30c all connected to wordlines WLa, WLb, WLc. Each DRAM cell 10d, 10e, 10f includes the respective vertical pass transistor storage cells 20d, 20e, 20f and control cells 30a, 30b, 30c all connected to wordlines WLa, WLb, WLc. Thus, in the layout depicted in FIG. 5, each control cell 30a, 30b, 30c is fabricated to effect the floating p-well condition for two adjacent vertical pass transistors (deep trench storage cells). Additionally shown in FIG. 5 are two bitlines BL1, BL2, with BL1 shown connecting source regions (not shown) of vertical pass transistors storage cells 20a, 20b, 20c and BL2 shown connecting source regions (not shown) of vertical pass transistors storage cells 20d, 20e, 20f.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

The invention claimed is:

1. A DRAM device comprising:
   a deep trench capacitor formed in a semiconductor substrate for receiving and storing a voltage;
   a storage cell including a vertical pass transistor having source and drain regions formed in a p-well, said drain region formed by a diffusion in said p-well outside said deep trench capacitor adjacent a first buried strap to conduct said voltage to said trench capacitor; and
   a control cell for controlling the threshold voltage of the vertical pass transistor according to a voltage of a gate connecting a second buried strap and diffusion region formed in the p-well region, said second buried strap region and diffusion region formed in said p-well region of said control cell being at a lower depth than the first buried stray and diffusion region formed in said p-well region of said storage cell, wherein a voltage applied at a gate connecting said second buried strap and diffusion region controls said threshold voltage of the vertical pass transistor in accordance with a depletion region formed in said p-well region by application of said applied gate voltage.

2. The DRAM device according to claim 1, wherein said gate voltage comprises a wordline (WL) voltage controlling access to data stored in said deep trench capacitor via said vertical pass transistor.

3. The DRAM device according to claim 2, wherein said depletion region formed at said second buried strap and diffusion region pinches off the p-well to disconnect the p-well region into two regions, a first conductive and second floating p-well region, wherein the floating p-well region enables a lower threshold voltage for turning on said vertical pass transistor during WL active state.

4. The DRAM device according to claim 2, wherein said depletion region formed at said second buried strap and diffusion region does not pinch off the p-well at WL inactive state.

5. The DRAM device according to claim 1, wherein a bitline voltage to be stored in said DRAM cell in a write operation is connected with a source of said vertical pass transistor.

6. The DRAM device according to claim 1, wherein said drain of said vertical pass transistor is formed by a diffusion at said first buried strap.

7. The DRAM device according to claim 1, wherein a gate at storage cell and control cell share the same wordline, the threshold voltage of the storage cell being modified according to the voltage at said wordline.

8. A method of improving performance of a DRAM cell comprising:
   a) providing two deep trenches, one trench including a vertical storage cell and deep trench capacitor for storing data and a second trench including a vertical control cell for controlling voltage at a p-well region separating the vertical storage and control cells;
   b) applying a voltage to a common conductor connecting a gate of each said vertical storage and control cell, said voltage being of a value enabling pinch-off of said p-well structure to thereby render said p-well region into a p-well floating condition having a first floating region and a second conductive region, wherein said p-well floating condition decreases the threshold voltage of said vertical storage cell when in an on-state as compared to when in an off-state thus resulting in increased gate over-drive and drive current.

9. The method as claimed in claim 8, wherein said common conductor is a wordline having a wordline active or inactive voltage state, said step b) of applying a voltage to a common conductor including: applying a wordline active voltage to enable reduction of storage cell gate threshold voltage to thereby increase drive current, or applying a wordline inactive voltage to turn off said storage cell, said wordline voltages being simultaneously applied to both gates of the storage and control cells.

10. The method as claimed in claim 8, wherein a vertical storage cell for storing data includes a vertical pass transistor having a drain diffusion region formed in the p-well at a first buried strap location connecting said trench capacitor and, said vertical control cell includes a second diffusion region formed in the p-well at a second buried strap location for controlling conductive state of said vertical pass transistor.

11. The method as claimed in claim 10, wherein said second diffusion region formed in the p-well at a second buried strap location is lower in depth than the drain diffusion region formed in the p-well at a first buried strap location.

* * * * *